(12) United States Patent
Hatakeyama (10) Patent No.: US 8,362,586 B2
(45) Date of Patent: Jan. 29, 2013

(54) SEMICONDUCTOR DEVICE

(75) Inventor: Tetsuo Hatakeyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 255 days.

(21) Appl. No.: 12/876,713

(22) Filed: Sep. 7, 2010

(65) Prior Publication Data

US 2011/0220913 A1    Sep. 15, 2011

(30) Foreign Application Priority Data

Mar. 10, 2010  (JP) ................................. 2010-052597

(51) Int. Cl.
*H01L 29/66* (2006.01)
(52) U.S. Cl. .................... 257/484; 257/492; 257/493
(58) Field of Classification Search .................. 257/484, 257/492, 493, E29.012, E29.338
See application file for complete search history.

(56) References Cited

U.S. PATENT DOCUMENTS

| | | | |
|---|---|---|---|
| 4,927,772 A | 5/1990 | Arthur et al. | |
| 6,002,159 A | 12/1999 | Bakowski et al. | |
| 7,649,213 B2 | 1/2010 | Hatakeyama et al. | |
| 7,777,292 B2 * | 8/2010 | Ota et al. ...................... | 257/472 |
| 2009/0160008 A1 * | 6/2009 | Fujiwara et al. .............. | 257/471 |

FOREIGN PATENT DOCUMENTS

| | | |
|---|---|---|
| JP | 03-094469 | 4/1991 |
| JP | 04-363068 | 12/1992 |
| JP | 2000-516767 | 12/2000 |
| JP | 2008-034646 | 2/2008 |

OTHER PUBLICATIONS

U.S. Appl. No. 13/227,032, filed Sep. 7, 2011, Hatakeyama.

Tetsuo Hatakeyama, "Measurements of Impact Ionization Coefficients of Electrons and Holes in 4H-SiC and Their Application to Device Simulation", Physica Status Solidi A 206, No. 10, 2009, pp. 2284-2294.

B. Jayant Baliga, "Power Semiconductor Devices", PWS Publishing, 1995, pp. 111-113.

Kazuo Arai, "Basis and Application of SiC Device", 2003, pp. 166-168 (in Japanese language).

T. Hatakeyama, et al., "Physical Modeling and Scaling Properties of 4H-SiC Power Devices", Proc. of 2005 International Conference on Simulation of Semiconductor Processes and Devices (SISPAD), 2005, pp. 171-174.

Office Action issued May 8, 2012, in Japanese Patent Application No. 2010-052597, (with English-language Translation).

* cited by examiner

*Primary Examiner* — Minh-Loan T Tran
(74) *Attorney, Agent, or Firm* — Oblon, Spivak, McClelland, Maier & Neustadt, L.L.P.

(57) ABSTRACT

According to one embodiment, a semiconductor device provided with a structure, which prevents withstand voltage deterioration and may be manufactured at a low cost, is provided. The semiconductor device is provided with a semiconductor substrate, a first conductive type semiconductor layer formed of silicon carbide formed on the substrate, an active region formed on a surface of the semiconductor layer, a second conductive type first semiconductor region formed on the surface of the semiconductor layer so as to surround the active region, a second semiconductor region provided on the surface of the semiconductor layer so as to contact the outside of the first semiconductor region to surround the first semiconductor region in which a second conductive type impurity region having impurity concentration and a depth identical to those of the first semiconductor region is formed into a mesh shape, a first electrode provided on the active region, and a second electrode provided on a backside of the semiconductor substrate.

10 Claims, 10 Drawing Sheets

DOSE AMOUNT OF SECOND SEMICONDUCTOR REGION [cm$^{-2}$]

SEMICONDUCTOR DEVICE

CROSS-REFERENCE TO RELATED APPLICATION

This application is based upon and claims the benefit of priority from Japanese Patent Application No. 2010-052597, filed on Mar. 10, 2010, the entire contents of which are incorporated herein by reference.

FIELD

Embodiments described herein relate generally to a semiconductor device.

BACKGROUND

In a semiconductor power device, a device structure and a device material for minimizing on-resistance and maximizing withstand voltage are required. Conventionally, the semiconductor power device is made of silicon as a semiconductor material, and PN junction formed on a surface referred to as junction termination extension (JTE) and a p-type layer ring structure are made on a portion on which field concentration occurs on a device termination, and it is designed to relax a field, thereby realizing high withstand voltage.

Conventionally, in a Schottky diode, for example, by minimizing the on-resistance and continuously forming a p-layer as the JTE (so-called RESURF layer) from a Schottky electrode portion to the outside, the p-type layer is depleted at the time of inverse bias and the field of the Schottky electrode end is relaxed, thereby obtaining high withstand voltage. The withstand voltage mainly depends on a value obtained by integrating concentration of the p-type layer in a depth direction, that is to say, a dose amount of ion for forming the p-type layer. In order to obtain ideal withstand voltage, it is required that the dose amount is a value near $\epsilon Ec/q$ when breakdown field strength is set to Ec, a dielectric constant is set to $\epsilon$, and an elementary electric charge is set to q.

Recently, the power device formed of silicon carbide (SiC) of which performance is extremely beyond that of the power device formed of the silicon has been developed. Since the silicon carbide is a wideband gap semiconductor and of which breakdown field strength is approximately 10 times as large as that of the silicon, this may improve trade-off between the withstand voltage and the on-resistance of the semiconductor power device. In the high withstand voltage semiconductor device formed of the silicon carbide also, as in the silicon, the JTE is formed on the surface to realize the high withstand voltage.

However, since the silicon carbide has anisotropy in the breakdown field strength, the field on an end of the JTE obliquely shifts from a C-axis direction in which the breakdown field strength is the largest, so that there is a problem that the withstand voltage drastically decreases. It is reported that, when setting the breakdown field strength on the C axis (<0001> direction) and an A axis (<11-20> direction orthogonal thereto in which a sign "-" is a "-" (bar) put on a numeral in a field of crystallography) to $Ec_1$ and $Ec_2$, respectively and setting donor concentration in the SiC substrate to Nd, $Ec_1$ and $Ec_2$ are represented by following equations (refer to the Non-patent Document 3). Meanwhile, strictly, the value is an actual measured value of the breakdown field strength in a direction perpendicular to the substrate and in a direction parallel to the substrate when an off angle with respect to the C axis is 8 degrees.

$$Ec_1 = 2.70 \times 10^6 \, (Nd/10^{16})^{0.1} \, [V/cm] \quad (1)$$

$$Ec_2 = 2.19 \times 10^6 \, (Nd/10^{16})^{0.1} \, [V/cm] \quad (2)$$

It is understood that the withstand voltage decreases from the ideal voltage on the C axis by 10% or larger in an A axis direction by the anisotropy in the withstand voltage.

In order to prevent the withstand voltage deterioration by the anisotropy in the withstand voltage, the JTE in which the p-layer with further lower concentration is provided outside the p-layer with the low concentration is suggested.

DETAILED DESCRIPTION

According to one embodiment, a semiconductor device provided with a structure, which prevents withstand voltage deterioration and may be manufactured at a low cost, is provided. The semiconductor device is provided with a semiconductor substrate, a first conductive type semiconductor layer formed of silicon carbide formed on the substrate, an active region formed on a surface of the semiconductor layer, a second conductive type first semiconductor region formed on the surface of the semiconductor layer so as to surround the active region, a second semiconductor region provided on the surface of the semiconductor layer so as to contact the outside of the first semiconductor region to surround the first semiconductor region in which a second conductive type impurity region having impurity concentration and a depth identical to those of the first semiconductor region is formed into a mesh shape, a first electrode provided on the active region, and a second electrode provided on a backside of the semiconductor substrate. Hereinafter, embodiments of the present invention are described in detail with reference to the drawings.

Meanwhile, in this specification, an "active region" of a semiconductor device is intended to mean a region in which a structure to realize a principal function of the semiconductor device, such as a region with Schottky junction when the semiconductor device is a Schottky diode and a region with a channel when this is a MISFET is present, for example.

(First Embodiment)

A semiconductor device of this embodiment is provided with a semiconductor substrate formed of silicon carbide in which an angle between a normal vector on a substrate surface and a <0001> direction or a <000-1> direction is not smaller than 0 degree and not larger than 8 degrees, a first conductive type semiconductor layer formed of the silicon carbide formed on the semiconductor substrate, an active region formed on a surface of the semiconductor layer, a second conductive type first semiconductor region formed on the surface of the semiconductor layer so as to surround the active region, a second semiconductor region provided on the surface of the semiconductor layer so as to contact the outside of the first semiconductor region to surround the first semiconductor region in which a second conductive type impurity region having impurity concentration and a depth identical to those of the first semiconductor region is formed into a mesh shape, a first electrode provided on the active region, and a second electrode provided on a backside of the semiconductor substrate. When a dielectric constant of the silicon carbide is set to $\epsilon$, breakdown field strength in the <0001> direction (or the <000-1> direction) and in a <11-20> direction of the silicon carbide is set to $Ec_1$ and $Ec_2$, respectively, and an elementary electric charge is set to q, a value of integral in a depth direction of the impurity concentration of the first semiconductor region is not smaller than $0.8\ \epsilon Ec_1/q$ and not larger than $1.2\ \epsilon Ec_1/q$, and a value obtained by averaging the value of integral in the depth direction of the impurity concentration of the impurity region in the second semiconductor region is not smaller than $0.4\ \epsilon Ec_2/q$ and not larger than $1.1\ \epsilon Ec_2/q$.

Herein, the "value obtained by averaging the value of integral in the depth direction of the impurity concentration of the impurity region in the second semiconductor region" is specifically a value obtained by multiplying a value obtained by integrating the impurity concentration of the second conductive type impurity region in the second semiconductor region in the depth direction by (an area of the second conductive type impurity region of the second semiconductor region)/(an area of the second semiconductor region). That is to say, this is the value of integral in the depth direction of the impurity concentration when the impurity in the impurity region is evenly distributed in the second semiconductor region.

The semiconductor device of this embodiment is provided with the first semiconductor region and the second semiconductor region arranged outside the first semiconductor region of which concentration is lower than that of the first semiconductor region on average as a JTE, thereby preventing withstand voltage deterioration on a device termination. Further, the second semiconductor region is composed of the impurity region having the impurity concentration and the depth identical to those of the first semiconductor region. By this configuration, it becomes possible to form the first and second semiconductor regions by an identical manufacturing process. Therefore, manufacture at a low cost becomes possible.

Figure 1:
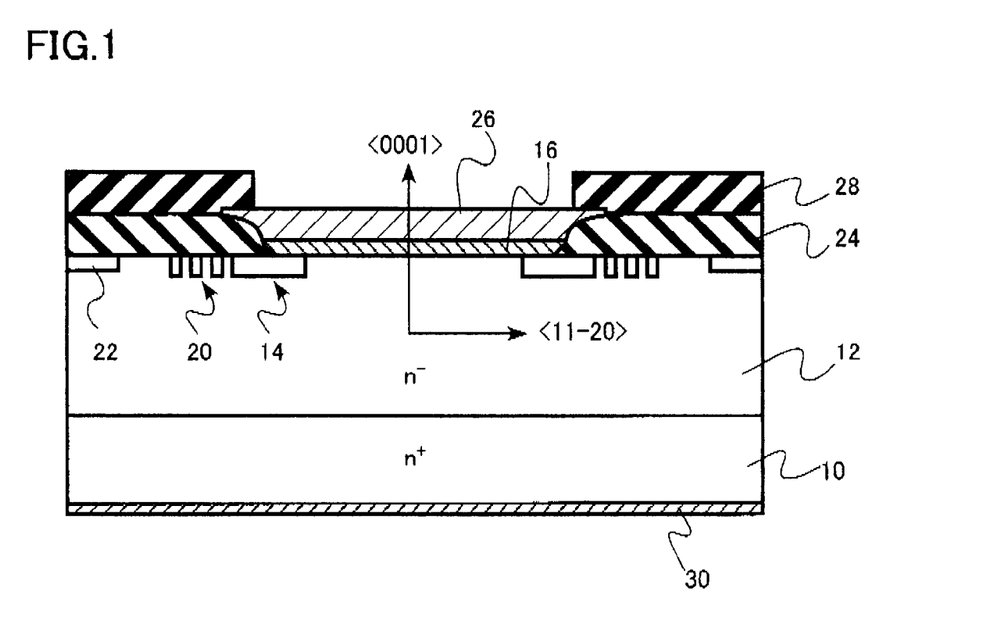
FIG. 1 is a schematic cross-sectional view of a semiconductor device of a first embodiment.
Figure 2:
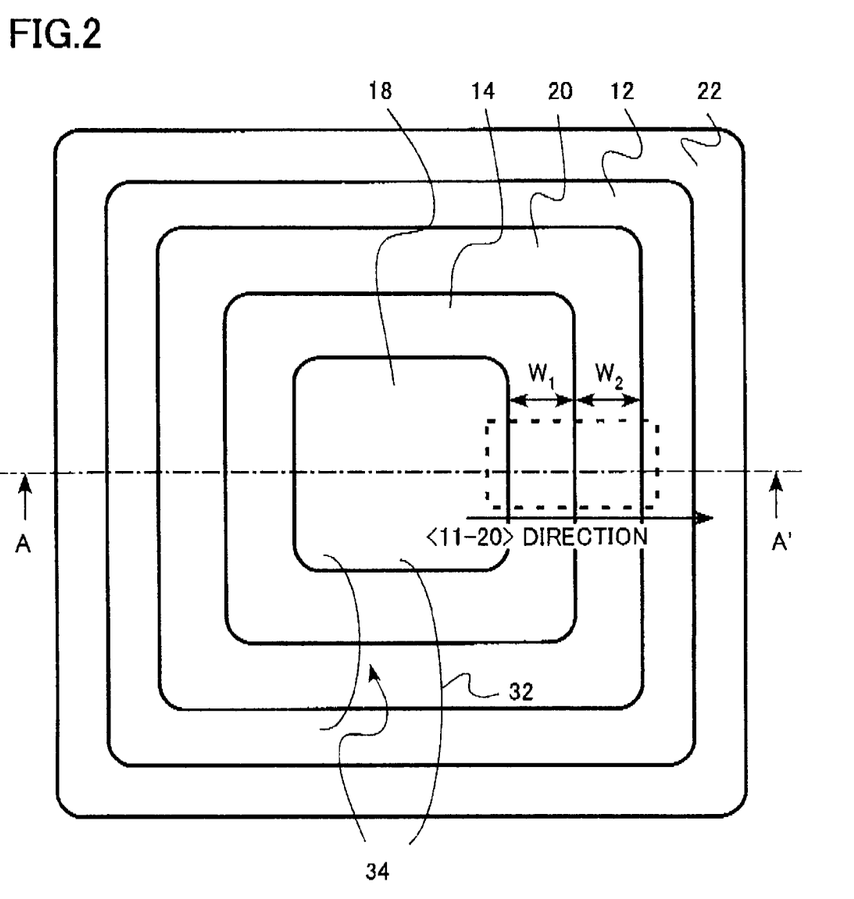
FIG. 2 is a schematic top view of the semiconductor device of the first embodiment.
Figure 3:
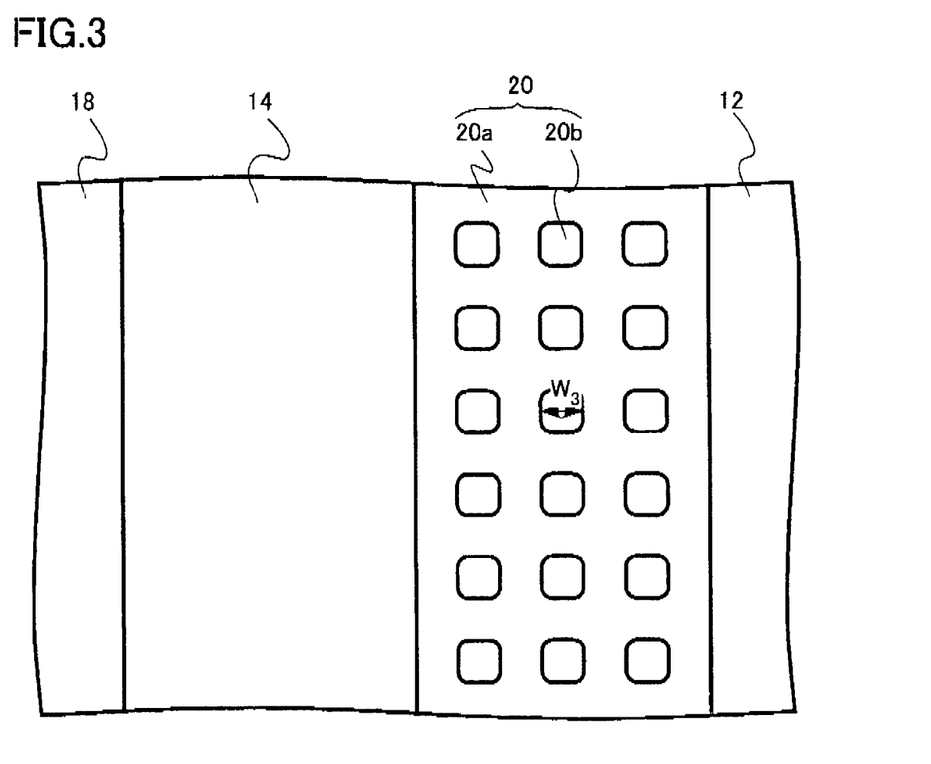
FIG. 3 is an enlarged view of a part of FIG. 2.

FIG. 1 is a schematic cross-sectional view of the semiconductor device of this embodiment. FIG. 2 is a schematic top view of the semiconductor device of this embodiment. FIG. 1 is a cross-sectional view taken along line AA' of FIG. 2. FIG. 3 is an enlarged view of a portion indicated by a dotted line of FIG. 2. Herein, the Schottky diode is described as an example of the semiconductor device.

As illustrated in FIG. 1, a Schottky barrier diode of this embodiment is formed on an n-type SiC semiconductor layer 12 epitaxially grown on an n+type Sic semiconductor substrate 10. Meanwhile, in the n+type Sic semiconductor substrate 10, the angle between the normal vector on the substrate surface and the <0001> direction or the <000-1> direction is not smaller than 0 degree and not larger than 8 degrees. A p-type first semiconductor region 14 is formed as the JTE on a surface of the n-type semiconductor layer 12.

There is an active region 18 in which a Schottky electrode 16 and the n-type SiC semiconductor layer 12 are connected by Schottky connection inside the first semiconductor region 14. The first semiconductor region 14 is formed so as to surround the active region 18 and a part of which is overlapped with the Schottky electrode 16 to be connected thereto. Meanwhile, FIGS. 2 and 3 are top views before the Schottky electrode 16 is formed.

Further, an n type second semiconductor region 20 is provided so as to contact the outside of the first semiconductor region 14 to surround the first semiconductor region 14. As illustrated in FIG. 3, in the second semiconductor region 20, a p-type impurity region 20a having the impurity concentration and the depth identical to those of the first semiconductor region 14 is formed into the mesh shape. That is to say, the second semiconductor region 20 is composed of the mesh-shaped p-type impurity region 20a and an island-shaped n-type impurity region 20b corresponding to the surface of the n-type SiC semiconductor layer 12.

Further, an n+type channel stopper region 22 is formed on an end of the surface of the n-type SiC semiconductor layer 12. Also, an outer end of the second semiconductor region 20 and an inner end of the n+type channel stopper region 22 are spaced apart from each other.

An upper surface of the n-type SiC semiconductor layer 12 is covered with a silicon oxide film 24, for example, a portion above the Schottky electrode 16 formed of Ti, for example, is opened, and thereafter, a first electrode (anode electrode) 26 formed of Al, for example, is formed.

Further, an entire surface is covered with a protective film 28 formed of polyimide and the like, and a portion above the first electrode 26 is opened. A second electrode (cathode electrode) 30 formed of Ni, for example, is formed on a backside of the n+type SiC semiconductor substrate 10.

Herein, a region composed of the first semiconductor region 14 and a region outer than the same is referred to as a termination region 32, and a region composed of the first semiconductor region 14 and the second semiconductor region 20 is referred to as junction termination extension (JTE) 34.

Figure 4:
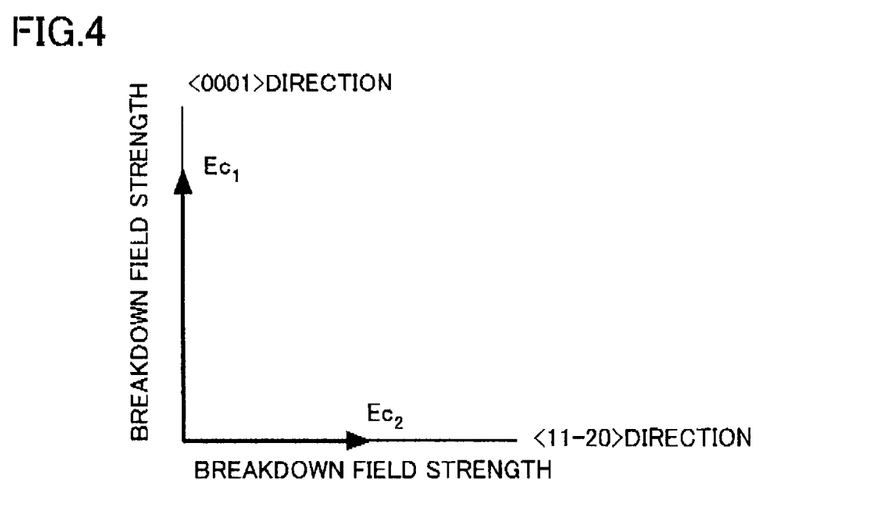
FIG. 4 is an illustrative diagram of anisotropy in a SiC semiconductor substrate.

The SiC semiconductor substrate used in this embodiment has anisotropy in withstand voltage as described above. FIG. 4 is an illustrative diagram of the anisotropy in the SiC semiconductor substrate. When setting the breakdown field strengths in the <0001> direction and that in the <11-20> direction to $Ec_1$ and $Ec_2$, respectively, they are represented as $Ec_1 > Ec_2$, as illustrated in FIG. 4. The values may be calculated using the above-described equations (1) and (2), respectively.

Meanwhile, the breakdown field strength by the above-described equations (1) and (2) is that when the angle between the normal vector of the substrate surface and the <0001> direction or the <000-1> direction is 8 degrees as described above, that is to say, when an off angle of the substrate surface is 8 degrees. Difference between the breakdown field strength in a direction perpendicular to the substrate surface and that in a direction parallel to the substrate when the off angle is 0 degree and those when the off angle is 8 degrees is less than 1%. Therefore, when the off angle is 0 degree also, the breakdown field strength may be regarded as identical to that when the off angle is 8 degrees. Therefore, the breakdown field strength may be regarded as identical in a range in which the angle between the normal vector on the substrate surface and the <0001> direction or the <000-1> direction is not smaller than 0 degree and not larger than 8 degrees.

Figure 5:
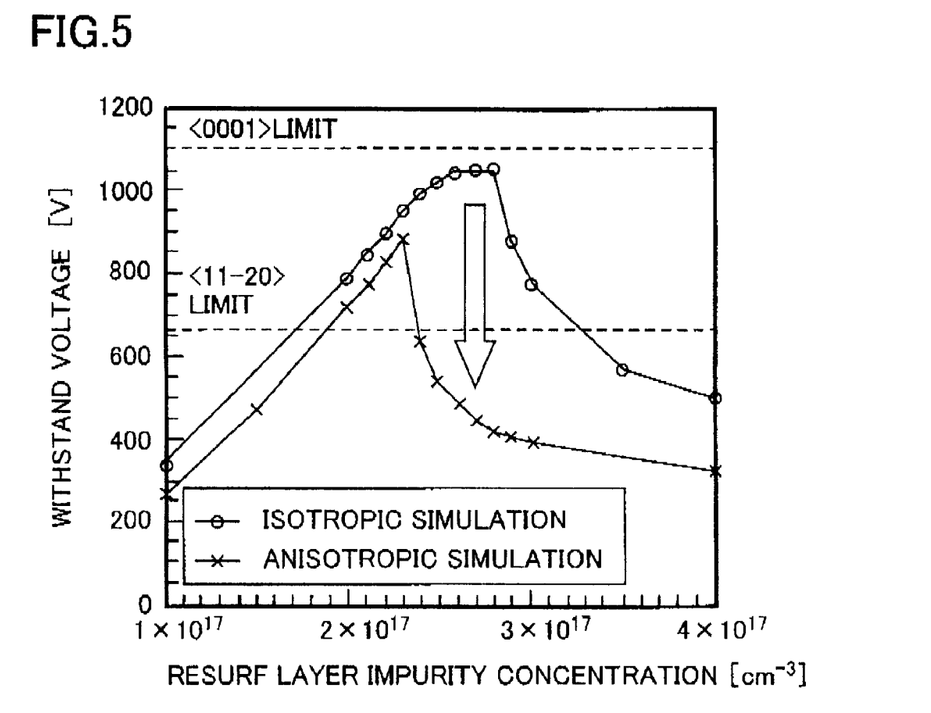
FIG. 5 is a view illustrating relationship between impurity concentration and withstand voltage of a conventional Schottky barrier diode.

FIG. 5 illustrates a simulation result of the withstand voltage deterioration by the anisotropy in the breakdown field strength in a conventional Schottky barrier diode (provided with one normal RESURF layer). 4H—SiC (silicon carbide) is used as the semiconductor layer.

The impurity concentration of the RESURF layer, which becomes the JTE, is represented along an abscissa axis, and dielectric breakdown voltage of the Schottky barrier diode is represented along a longitudinal axis. In general, the dielectric breakdown voltage is a function of a value obtained by integrating the impurity concentration of the semiconductor region in the depth direction (hereinafter, also referred to as a dose amount). In this calculation, the concentration is made uniform and the depth is set to 0.6 μm. Isotropy of the breakdown field strength is supposed, and the simulation result by setting an absolute value thereof to a value in the <0001> direction is indicated by data with circle marks. According to the result, when the concentration of the first semiconductor region is optimized, a value of the withstand voltage substantially equal to ideal withstand voltage in the <0001> direction (indicated as <0001> limit) is obtained.

On the other hand, the anisotropy in the breakdown field strength is introduced corresponding to reality, and a result of calculation of the dielectric breakdown voltage by setting the breakdown field strength in the <0001> direction and that in the <11-20> direction to experimental values is indicated by data with cross marks. According to the calculation result, the dielectric breakdown voltage decreases by approximately 10% as compared to the ideal withstand voltage in the <0001> direction, and optimum impurity concentration of the RESURF layer is different from that in a case in which the anisotropy is not taken into account. It is understood that the withstand voltage decreases by 50% or more by setting the impurity concentration of the RESURF layer to an optimum value by a conventional design method (isotropic simulation).

Figure 6:
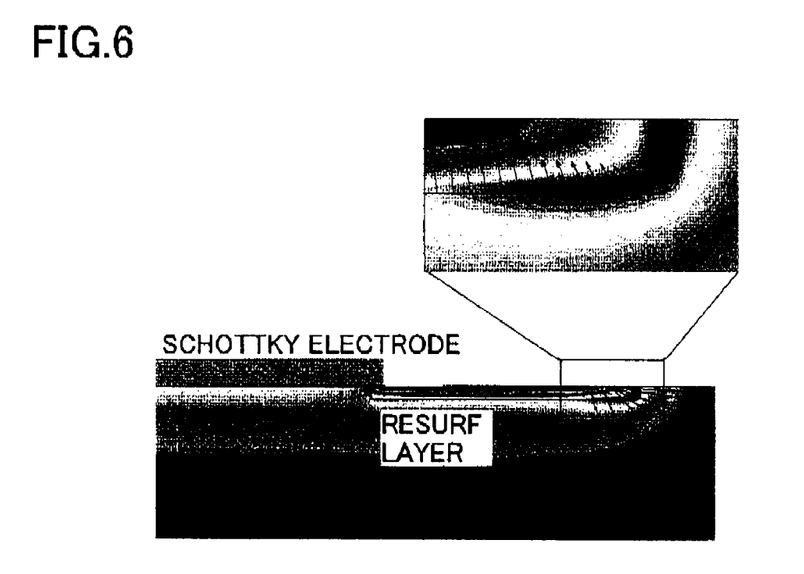
FIG. 6 is a simulation result of field distribution and field strength of the conventional Schottky barrier diode.

FIG. 6 is a simulation result of field distribution and a direction and a size of the field strength in the conventional Schottky barrier diode provided with only one RESURF layer. By setting design concentration of the p-type layer being the RESURF layer to the optimum value in the conventional design, a direction of the field shifts in a direction perpendicular to a C axis on an end of a termination structure, so that the withstand voltage decreases.

The size and the direction of the field are indicated by arrows in the drawing. It is understood that the arrow significantly extends in the direction parallel to the substrate surface on the end of the RESURF layer. Since the breakdown strength in this direction is smaller than that in the direction perpendicular to the substrate surface as illustrated in FIG. 4, the withstand voltage decreases. Meanwhile, distribution of the field strength is represented by color gradation.

Figure 7:
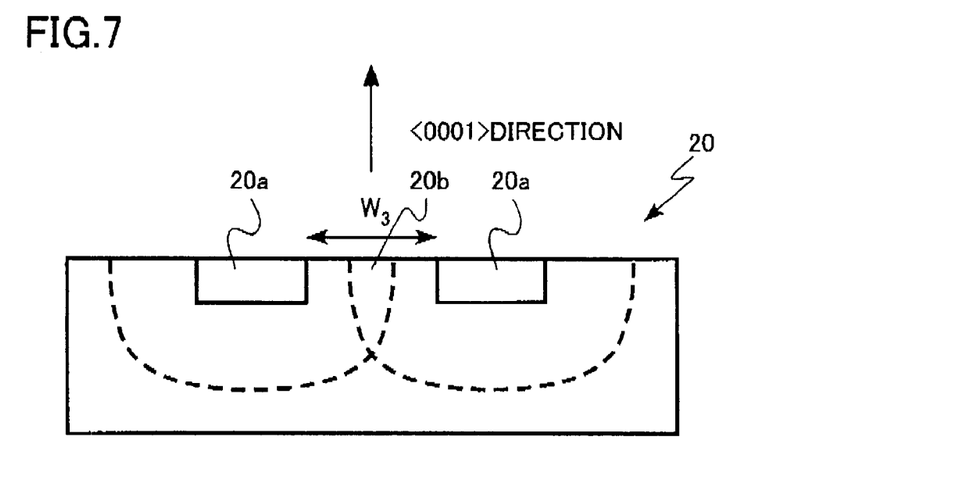
FIG. 7 is an illustrative diagram of action of a second semiconductor region of the first embodiment.

FIG. 7 is an illustrative diagram of action of the second semiconductor region of this embodiment. A depleted layer extending when fixing potential of the p-type impurity region $20a$ of the second semiconductor region $20$ to $0$ and applying inverse bias from a substrate side is indicated by a dotted line. Since the potential of the p-type impurity region $20a$ is fixed, the depleted layer extends not only in a substrate direction but also in a lateral direction.

Therefore, when the size of the p-type impurity region $20a$ is comparable with or smaller than extension of the depleted layer in a longitudinal direction, an entire p-type impurity region $20a$ is depleted more quickly when applying a voltage than a case in which the p-type layer unlimitedly extends. In the second semiconductor region, the p-type impurity region $20a$ having the impurity concentration and the depth identical to those of the first semiconductor region is formed into the mesh shape. This structure is equivalent to the structure in which the semiconductor region of which concentration is lower than that of the first semiconductor region is provided outside the first semiconductor region.

Also, as illustrated in FIG. 7, it is desirable that a separation distance $W_3$ (space of the mesh shape) between the p-type impurity regions $20a$ is not larger than a distance with which the depleted layers stick to each other before achieving the dielectric breakdown voltage from a viewpoint of relaxing the field parallel to the substrate surface.

Figure 8:
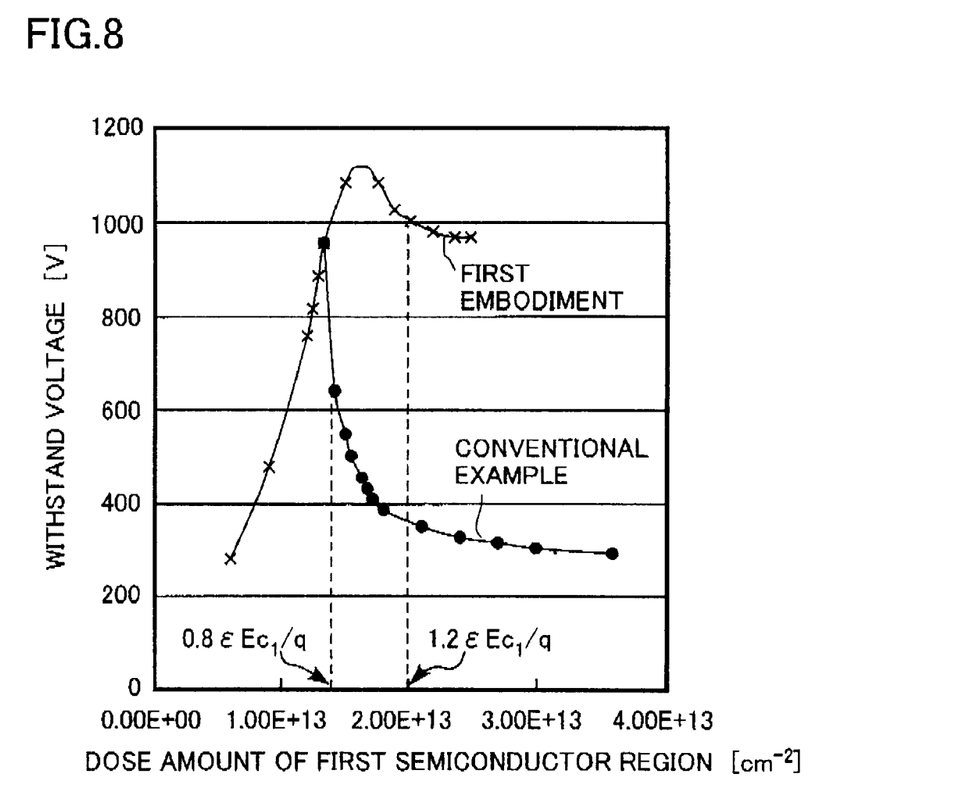
FIG. 8 is a view illustrating relationship between a dose amount and withstand voltage of a first semiconductor region of the semiconductor device of the first embodiment.

FIG. 8 is a view illustrating relationship between the dose amount and the withstand voltage of the first semiconductor region of the semiconductor device of this embodiment. This is a result of comparison of the withstand voltage of the Schottky diode of this embodiment (data with cross marks) and that of the conventional Schottky diode provided with only the first semiconductor region (data with circle marks) by the simulation. In a conventional example, the dose amount of the RESURF layer corresponding to the first semiconductor region is represented along the abscissa axis. In this embodiment, the dose amount of the first semiconductor region inside the JTE is represented along the abscissa axis.

According to this embodiment, it becomes possible to improve the withstand voltage to a limit value in the <0001> direction. Also, a maximum effect is obtained when the dose amount of the first semiconductor region, that is to say, the value of integral in the depth direction of the impurity concentration is $Ec_1/q$, and the effect is obtained in a range not smaller than $0.8\ \epsilon Ec_1/q$ and not larger than $1.2\ \epsilon Ec_1/q$.

When the dose amount is larger than the above-described range, field concentration occurs on the end of the RESURF layer and the withstand voltage decreases. On the other hand, when the dose amount is smaller than the above-described range, the RESURF layer is completely depleted and a field screening effect of the RESURF layer is deficient, so that the field concentration occurs on an end of the Schottky electrode and the withstand voltage decreases.

Figure 9:
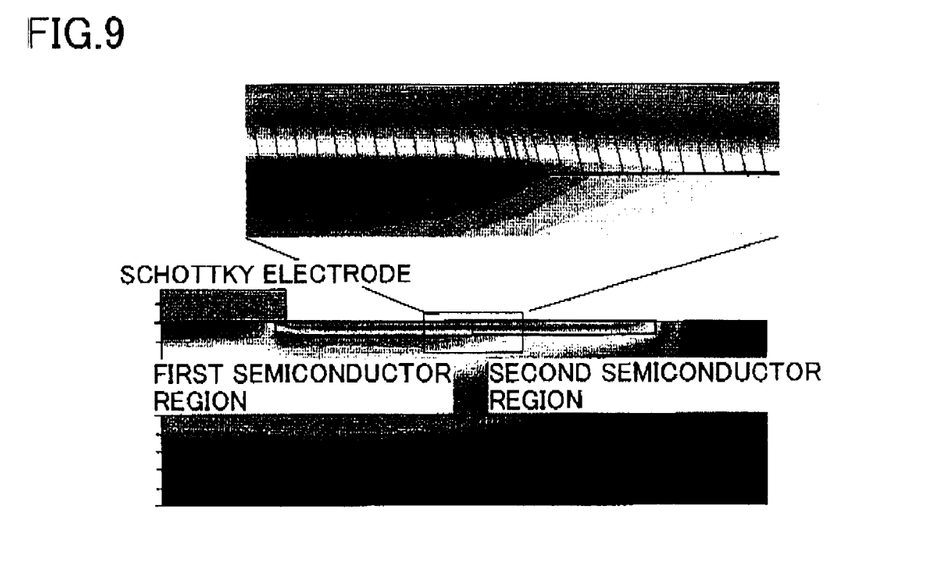
FIG. 9 is a view for illustrating an effect of the first embodiment.

FIG. 9 is a view for illustrating an effect of the first embodiment. This is a simulation result of the field distribution and the direction and the size of the field strength in the JTE in this embodiment. The size and the direction of the field are indicated by the arrows in the drawing. The distribution of the field strength is represented by the color gradation.

As illustrated in the drawing, in this embodiment, in a maximum field in a device, that is to say, on a boundary between the first semiconductor region and the second semiconductor region, the maximum field is aligned in the <0001> direction. That is to say, a structure is such that the field from a lateral side in which the breakdown strength is low is inhibited by the second semiconductor region and the field is received in a longitudinal direction in which the breakdown strength is high.

In this manner, in this embodiment, the second semiconductor region being an outer JTE contributes to relax the field in the <11-20> direction, and the first semiconductor region being an inner JTE contributes to relax the field in the <0001> direction.

Figure 10:
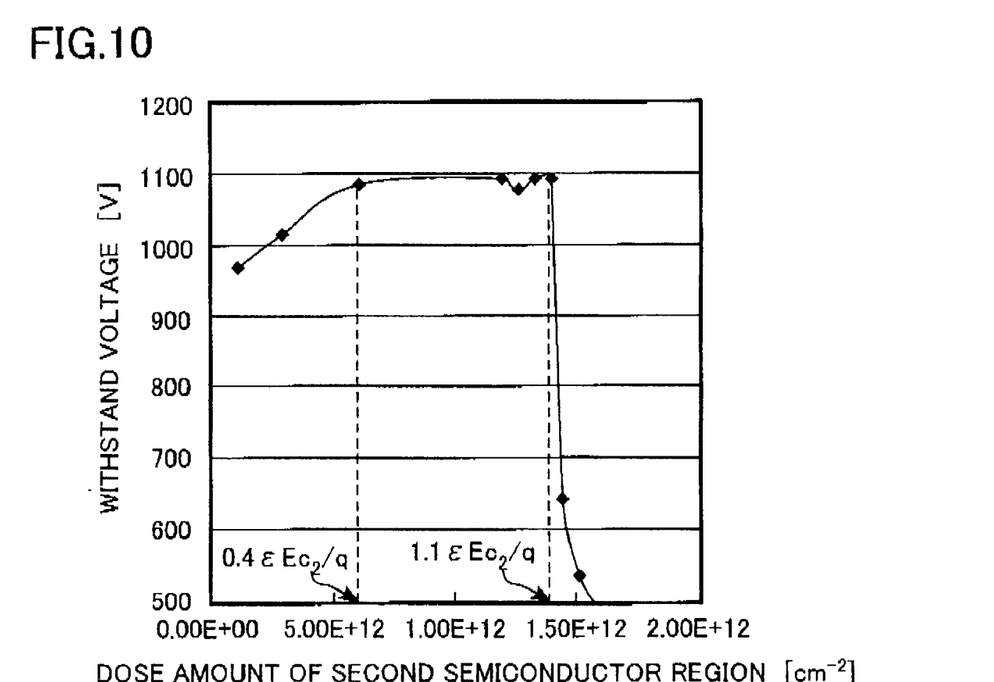
FIG. 10 is a view for illustrating relationship between the dose amount and the withstand voltage of the second semiconductor region of the first embodiment.

FIG. 10 is a result of obtaining an optimum dose amount range of the second semiconductor region by the simulation.

Meanwhile, the dose amount of the second semiconductor region is herein a value obtained by averaging the value of integral in the depth direction of the impurity concentration of the p-type impurity region 20a in FIG. 3 in the second semiconductor region. In other words, this is the dose amount when the p-type impurity in the second semiconductor region is uniformly distributed in the second semiconductor region.

When the dose amount of the second semiconductor region becomes larger than $1.1\, \epsilon Ec_2/q$, the field concentration occurs or the end of the second semiconductor region and the withstand voltage drastically decreases. On the other hand, as for a lower limit of the dose amount, there is an effect of preventing the withstand voltage deterioration when this is not smaller than $0.4\, \epsilon Ec_2/q$.

Figure 11:
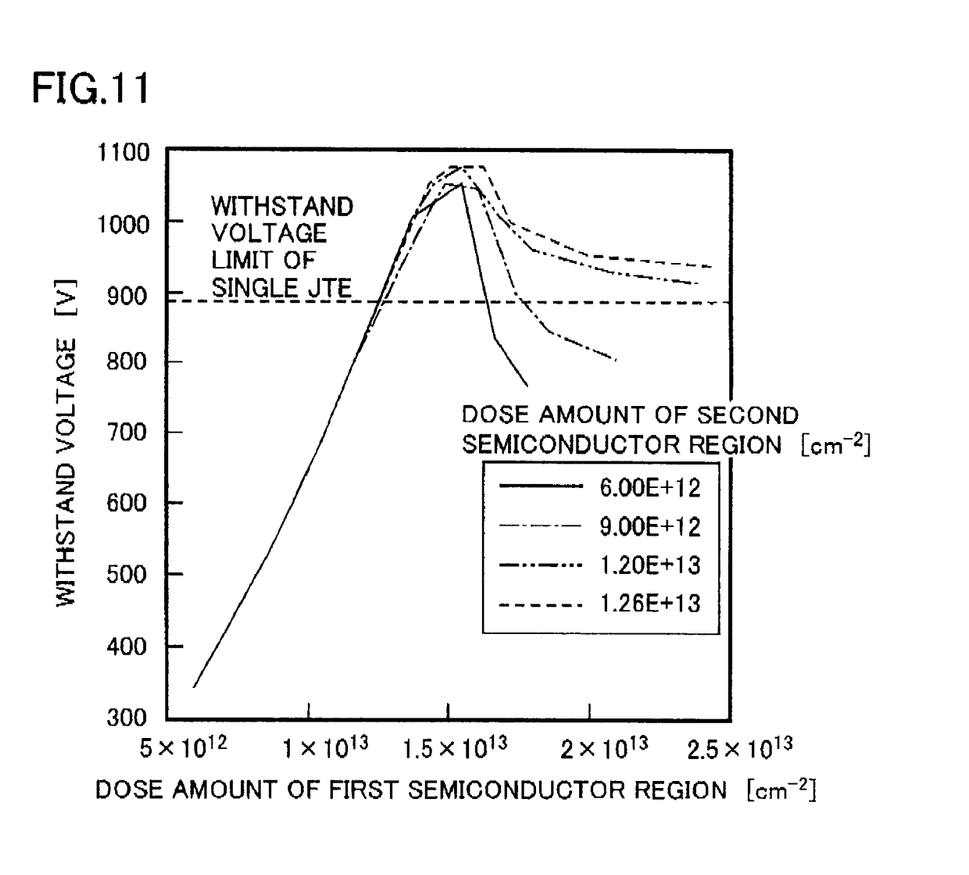
FIG. 11 is a view for illustrating dependency of an optimum dose amount of the first semiconductor region on the dose amount of the second semiconductor region of the first embodiment.

FIG. 11 is a view illustrating dependency of the optimum dose amount of the first semiconductor region on the dose amount of the second semiconductor region. It is understood that a dose amount margin of the first semiconductor region decreases when the dose amount of the second semiconductor region becomes smaller than the optimum value. However, a peak value of the withstand voltage is larger than a single JTE withstand voltage limit value, so that it is understood that the effect to relax the field in the lateral direction is maintained. Meanwhile, the single JTE withstand voltage limit value is intended to mean an upper limit of the withstand voltage in the conventional example when the JTE is only the RESURF layer.

It is desirable that a length in the lateral direction of the JTE is set to substantially the same as or larger than the length in the lateral direction of the depleted layer around the electrode to terminate a line of electric force from the depleted layer of this region. The extension of the depleted layer is represented by $\epsilon Ec_1/qNd$ as the length of the depleted layer in the longitudinal direction.

In this embodiment, since the JTE is composed of the inner first semiconductor region and the outer second semiconductor region, it is desirable that a width of the two regions is not smaller than $\epsilon Ec_1/qNd$. Therefore, it is desirable that the sum of a width $W_1$ of the first semiconductor region and a width $W_2$ of the second semiconductor region is not smaller than $\epsilon Ec/qNd$. It is more desirable that the width $W_1$ of the first semiconductor region is not smaller than $\epsilon Ec_1/qNd$.

Herein, a width of the depleted layer, which may be supported by the second semiconductor region, may be represented by (the dose amount of the second semiconductor region/Nd). Then, it is desirable that the width $W_1$ of the first semiconductor region is not smaller than $\{\epsilon Ec_1/qNd-(\text{the dose amount of the second semiconductor region/Nd})\}$.

Also, it is desirable that the breakdown field strength $Ec_2$ in the <11-20> direction is supported by the second semiconductor region. Therefore, it is desirable that the width $W_2$ of the second semiconductor region is not smaller than $\epsilon Ec_2/qNd$.

Also, as described above, it is desirable that the distance $W_3$ (space of the mesh shape) between the p-type impurity regions 20a is not larger than the distance with which the deleted layers stick to each other before achieving the dielectric breakdown voltage. The extension of the depleted layer when supporting the breakdown field strength $Ec_2$ of the second semiconductor region is $\epsilon Ec_2/qNd$. Therefore, it is desirable that the distance $W_3$ between the impurity regions is not larger than $2\times\epsilon Ec_2/qNd$.

Meanwhile, in the above-described equation, the dielectric constant of the silicon carbide is set to $\epsilon$, the breakdown field strength in the <0001> direction and that in the <11-20> direction of the silicon carbide are set to $Ec_1$ and $Ec_2$, respectively, the elementary electric charge is set to q, and donor concentration in the semiconductor layer is set to Nd.

As described above, according to this embodiment, the second semiconductor region being the p-type region with substantially further lower concentration is provided outside the first semiconductor region being the p-type region with low concentration by forming the p-type impurity region into the mesh shape. With the configuration, the withstand voltage may be maximized in the silicon carbide semiconductor having the anisotropy in the breakdown field strength, and an original performance of the semiconductor may be brought out.

Further, in this embodiment, in the second semiconductor region, the second conductive type impurity region having the impurity concentration and the depth identical to those of the first semiconductor region is formed into the mesh shape. Therefore, it becomes possible to simultaneously form the first semiconductor region and the second semiconductor region by an identical lithography process and an identical ion implantation process when forming the JTE. Therefore, the manufacture at a low cost becomes possible.

(Second Embodiment)

A semiconductor device of this embodiment is similar to that of the first embodiment except that a ratio of the impurity region in the second semiconductor region decreases from the inside to the outside of the second semiconductor region. Therefore, the description of the contents overlapped with those of the first embodiment is omitted.

Figure 12:
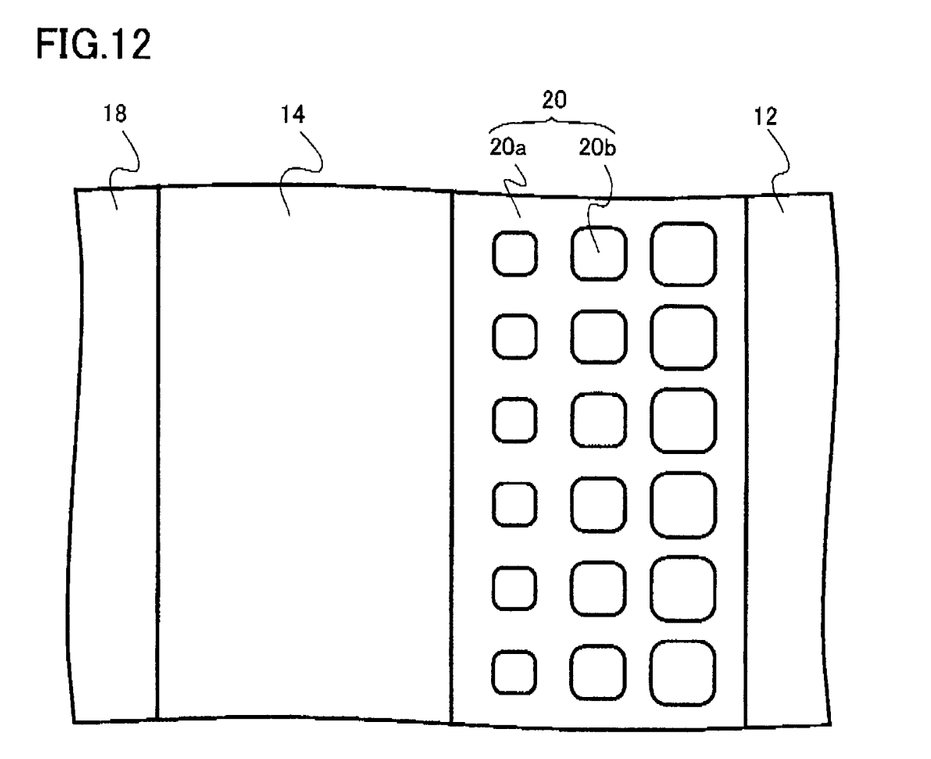
FIG. 12 is a top view illustrating a specific example of the semiconductor device of a second embodiment.

FIG. 12 is a top view illustrating a specific example of the semiconductor device of this embodiment. This is an enlarged view of the JTE portion. As illustrated, it is configured such that the ratio of the p-type impurity region 20a in the second semiconductor region 20 decreases from the inside to the outside of the second semiconductor region 20 depending on a size of the n-type impurity region 20b, which becomes larger from the inside to the outside of the second semiconductor region.

By this configuration, the dose amount of the p-type impurity in the second semiconductor region 20 substantially decreases from the inside to the outside. Therefore, a field relaxing effect in the lateral direction by the second semiconductor region is improved as compared to that in the first embodiment.

Figure 13:
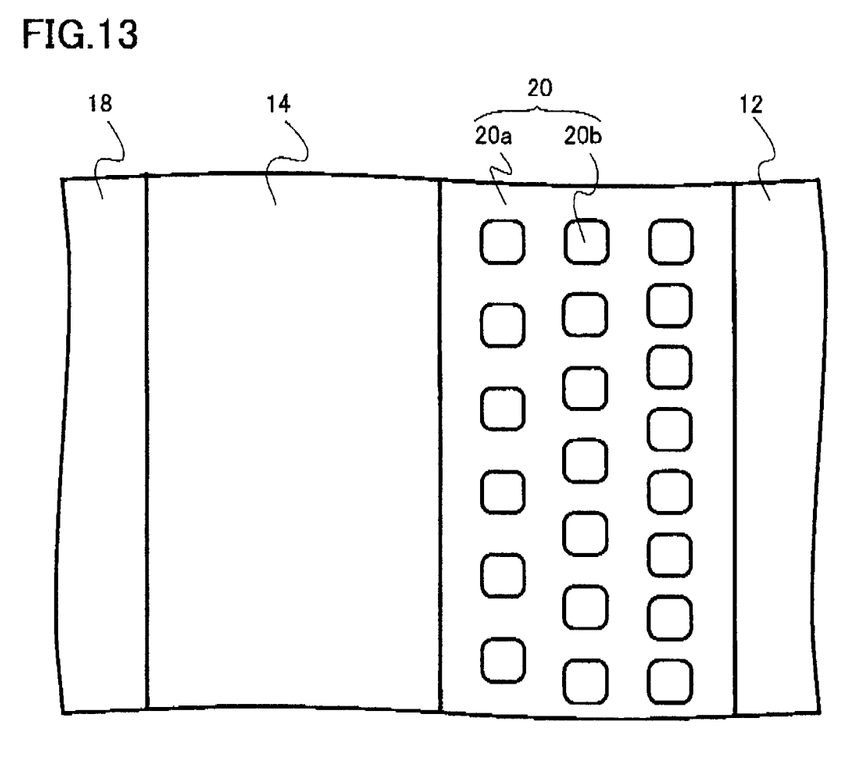
FIG. 13 is a top view illustrating another specific example of the semiconductor device of the second embodiment.

FIG. 13 is a top view illustrating another specific example of the semiconductor device of this embodiment. This is an enlarged view of the JTE portion. As illustrated, it is configured such that the ratio of the p-type impurity region 20a in the second semiconductor region 20 decreases from the inside to the outside of the second semiconductor region 20 depending on density of the n-type impurity region 20b, which becomes higher from the inside to the outside of the second semiconductor region.

With the configuration in FIG. 13 also, the effect similar to that of the configuration in FIG. 12 is obtained.

(Third Embodiment)

A semiconductor device of this embodiment is different from that of the first embodiment in that this is a pn diode. The description of the contents overlapped with those of the first embodiment is omitted.

Figure 14:
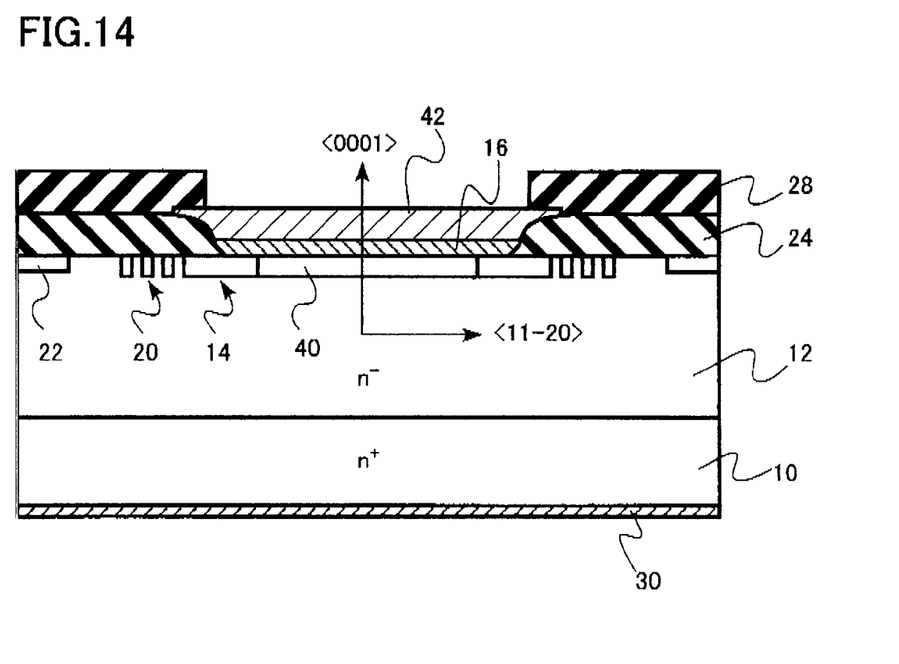
FIG. 14 is a schematic cross-sectional view of the semiconductor device of a third embodiment.

FIG. 14 is a schematic cross-sectional view of the semiconductor device of this embodiment. A p+type anode region 40 is provided on the active region surrounded by the first semiconductor region 14 and an anode electrode 42 is provided thereon. That is to say, a pn diode structure is formed. Herein, the electrode 16 and the p+type anode region 40 are connected by ohmic connection.

With the configuration also, the effect similar to that of the first embodiment may be obtained. Meanwhile, it goes without saying that the JTE may be made similar to that of the second embodiment.

(Fourth Embodiment)

A semiconductor device of this embodiment is different from that of the first embodiment in that this is the MISFET. The description of the contents overlapped with those of the first embodiment is omitted.

Figure 15:
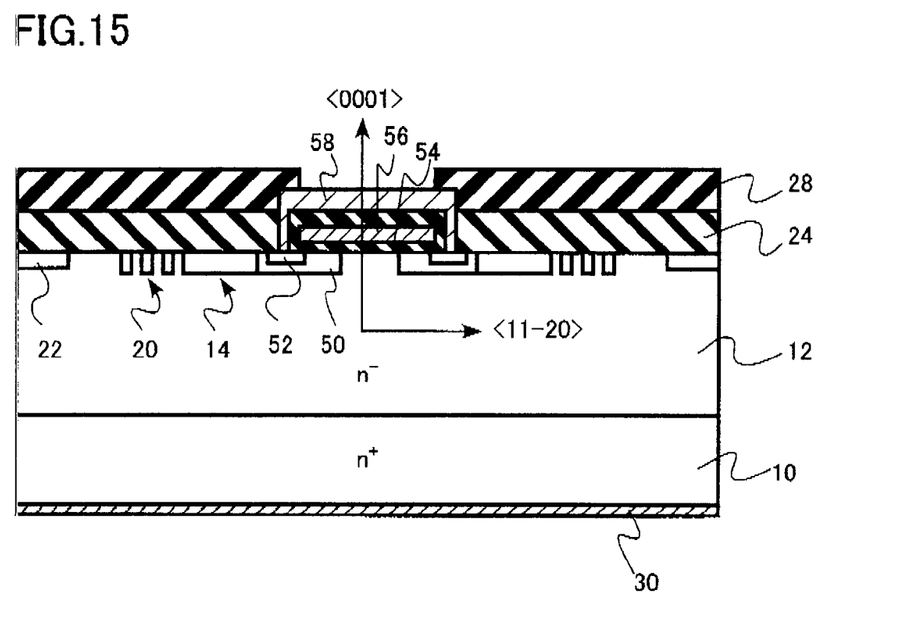
FIG. 15 is a schematic cross-sectional view of the semiconductor device of a fourth embodiment.

FIG. 15 is a schematic cross-sectional view of the semiconductor device of this embodiment. A p type channel region 50, an n type source region 52, an insulating film 54, a gate electrode 56, and a source electrode 58 are formed on the active region surrounded by the first semiconductor region 14. Herein, the n+type semiconductor substrate 10 becomes a drain region and the second electrode 30 becomes a drain electrode. In this manner, the MISFET structure is formed on the active region.

Meanwhile, when the n+type semiconductor substrate 10 is changed to the p+type, an IGBT may be obtained.

In this configuration also, the effect similar to that of the first embodiment may be obtained. Meanwhile, it goes without saying that the JTE may be made similar to that of the second embodiment.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, although the case in which the first conductive type is the n type and the second conductive type is the p type is described as an example in this embodiment, it is also possible to obtain the similar effect by reversing the conductive types.

What is claimed is:

1. A semiconductor device, comprising:
   a semiconductor substrate formed of silicon carbide with an angle between a normal vector on the substrate surface and a <0001> direction or a <000-1> direction is not smaller than 0 degree and not larger than 8 degrees;
   a first conductive type semiconductor layer formed of the silicon carbide formed on the semiconductor substrate;
   an active region formed on a surface of the semiconductor layer;
   a second conductive type first semiconductor region formed on the surface of the semiconductor layer so as to surround the active region;
   a second semiconductor region provided on the surface of the semiconductor layer so as to contact outside of the first semiconductor region to surround the first semiconductor region, a second conductive type impurity region having impurity concentration and a depth identical to the impurity concentration and the depth of the first semiconductor region is formed into a mesh shape in the second semiconductor region;
   a first electrode provided on the active region; and
   a second electrode provided on a backside of the semiconductor substrate,
   wherein when a dielectric constant of the silicon carbide is set to $\epsilon$, breakdown field strength of the silicon carbide in the <0001> direction and the breakdown field strength in a <11-20> direction are set to $Ec_1$ and $Ec_2$, respectively, and an elementary electric charge is set to q, a value of integral in a depth direction of the impurity concentration of the first semiconductor region is not smaller than 0.8 $\epsilon Ec_1/q$ and not larger than 1.2 $\epsilon Ec_1/q$, and
   a value obtained by averaging the value of integral in the depth direction of the impurity concentration of the impurity region in the second semiconductor region is not smaller than 0.4 $\epsilon Ec_2/q$ and not larger than 1.1 $\epsilon Ec_2/q$.

2. The device according to claim 1, wherein when the semiconductor layer is an n type and donor concentration of the semiconductor layer is set to Nd, the sum of a width of the first semiconductor region and a width of the second semiconductor region is not smaller than $\epsilon Ec_1/qNd$.

3. The device according to claim 1, wherein when the semiconductor layer is an n type and donor concentration of the semiconductor layer is set to Nd, a width of the second semiconductor region is not smaller than $\epsilon Ec_2/qNd$.

4. The device according to claim 1, wherein when the semiconductor layer is an n type and donor concentration of the semiconductor layer is set to Nd, a space of the mesh shape is not larger than $2 \times \epsilon Ec_2/qNd$.

5. The device according to claim 1, wherein a ratio of the impurity region in the second semiconductor region decreases from inside to outside of the second semiconductor region.

6. The semiconductor device according to claim 1, wherein the first semiconductor region is connected to the first electrode.

7. The semiconductor device according to claim 1, wherein the semiconductor substrate is a first conductive type, the first electrode contacts the semiconductor layer by Schottky contact, and a Schottky barrier diode structure is formed.

8. The semiconductor device according to claim 1, further comprising: a second conductive type third semiconductor region in the active region, wherein the semiconductor substrate is a first conductive type, and a pn diode structure is formed.

9. The semiconductor device according to claim 1, wherein the semiconductor substrate is a first conductive type, and a MISFET structure is formed.

10. The semiconductor device according to claim 1, wherein the semiconductor substrate is a second conductive type, and an IGBT structure is formed.

* * * * *